(12) United States Patent
Yanagita et al.

(10) Patent No.: US 11,059,437 B2
(45) Date of Patent: Jul. 13, 2021

(54) ELECTRONIC MODULE

(71) Applicant: Sumitomo Wiring Systems, Ltd., Mie (JP)

(72) Inventors: Yoshiki Yanagita, Mie (JP); Takumi Ejima, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/739,326

(22) Filed: Jan. 10, 2020

(65) Prior Publication Data

US 2020/0269783 A1 Aug. 27, 2020

(30) Foreign Application Priority Data

Feb. 21, 2019 (JP) .............................. JP2019-029389

(51) Int. Cl.
*H01R 12/00* (2006.01)
*B60R 16/023* (2006.01)
*H05K 5/02* (2006.01)

(52) U.S. Cl.
CPC ....... *B60R 16/0239* (2013.01); *H05K 5/0204* (2013.01); *B60Y 2304/07* (2013.01)

(58) Field of Classification Search
CPC .......................... H05K 5/0204; B60R 16/0239
USPC ..................................................... 439/76.2
See application file for complete search history.

(56) References Cited

U.S. PATENT DOCUMENTS

| | | | |
|---|---|---|---|
| 6,570,088 B1* | 5/2003 | Depp ................... | B60R 16/0238 174/50 |
| 7,544,065 B2* | 6/2009 | Ito ....................... | H01R 9/2466 439/76.2 |
| 7,549,873 B2* | 6/2009 | Hayakawa ............ | H05K 7/026 439/76.2 |
| 7,733,632 B2* | 6/2010 | Ito ....................... | H05K 7/026 361/626 |
| 7,893,364 B2* | 2/2011 | Oda ...................... | H05K 7/026 174/520 |
| 8,004,853 B2* | 8/2011 | Kita .................... | B60R 16/0238 361/775 |
| 8,035,040 B2* | 10/2011 | Nishikawa ............. | G01R 1/203 174/541 |

FOREIGN PATENT DOCUMENTS

JP 2014-079093 A 5/2014

\* cited by examiner

*Primary Examiner* — Abdullah A Riyami
*Assistant Examiner* — Vladimir Imas
(74) *Attorney, Agent, or Firm* — Honigman LLP

(57) ABSTRACT

Provided is an electronic module that can be made more compact. A vehicle electronic module includes a casing that is to be fixed to an object, the casing including a first plate portion facing the object and a ceiling plate opposed to the first plate portion, wherein the electronic module includes: a connection portion that is provided on the ceiling plate, and to which an external connector is to be connected; and a fuse portion disposed overlapping the connection portion in an opposing direction of the first plate portion and the ceiling plate.

11 Claims, 7 Drawing Sheets

ELECTRONIC MODULE

CROSS-REFERENCE TO RELATED APPLICATIONS

This application claims priority of Japanese Patent Application No. JP 2019-029389 filed on Feb. 21, 2019, the contents of which are incorporated herein.

TECHNICAL FIELD

The present disclosure relates to a vehicle electronic module including a casing that is to be fixed to an object.

BACKGROUND

Conventionally, an electronic module that houses electronic components such as a relay is mounted on a vehicle.

JP 2014-79093A discloses a power supply device including a relay that includes a contact capable of being opened and closed, and an exciting coil for switching opening/closing of the contact. By electrically connecting the contact of the relay to a bus bar, and providing the bus bar with a heat dissipation mechanism, the bus bar can be used as both a current path and a heat dissipation path, thus making it possible to improve the heat dissipation properties of the relay.

JP 2014-79093A is an example of related art.

The recent increase in the number of functions that a vehicle is provided with makes it necessary to control various functions, and the internal structure of an electronic module is becoming increasingly complex. Such increased complexity of an electronic module leads to an increase in the size of the electronic module, and therefore is not desirable from the viewpoint of increasing the compactness of a vehicle.

However, the power supply device disclosed in JP 2014-79093A does not attempt to increase the compactness of the electronic module, and cannot solve such a problem.

The present disclosure has been made in view of such circumstances, and it is an object of the disclosure to provide an electronic module that can be made more compact.

SUMMARY

An electronic module according to an embodiment of the present disclosure is a vehicle electronic module including a casing that is to be fixed to an object, the casing including a first plate portion facing the object and a second plate portion opposed to the first plate portion, wherein the electronic module includes: a connection portion that is provided on the second plate portion, and to which an external connector is to be connected; and a fuse portion disposed overlapping the connection portion in an opposing direction of the first plate portion and the second plate portion.

According to the present disclosure, an electronic module that can be made more compact can be provided.

DETAILED DESCRIPTION OF PREFERRED EMBODIMENTS

Figure 1:
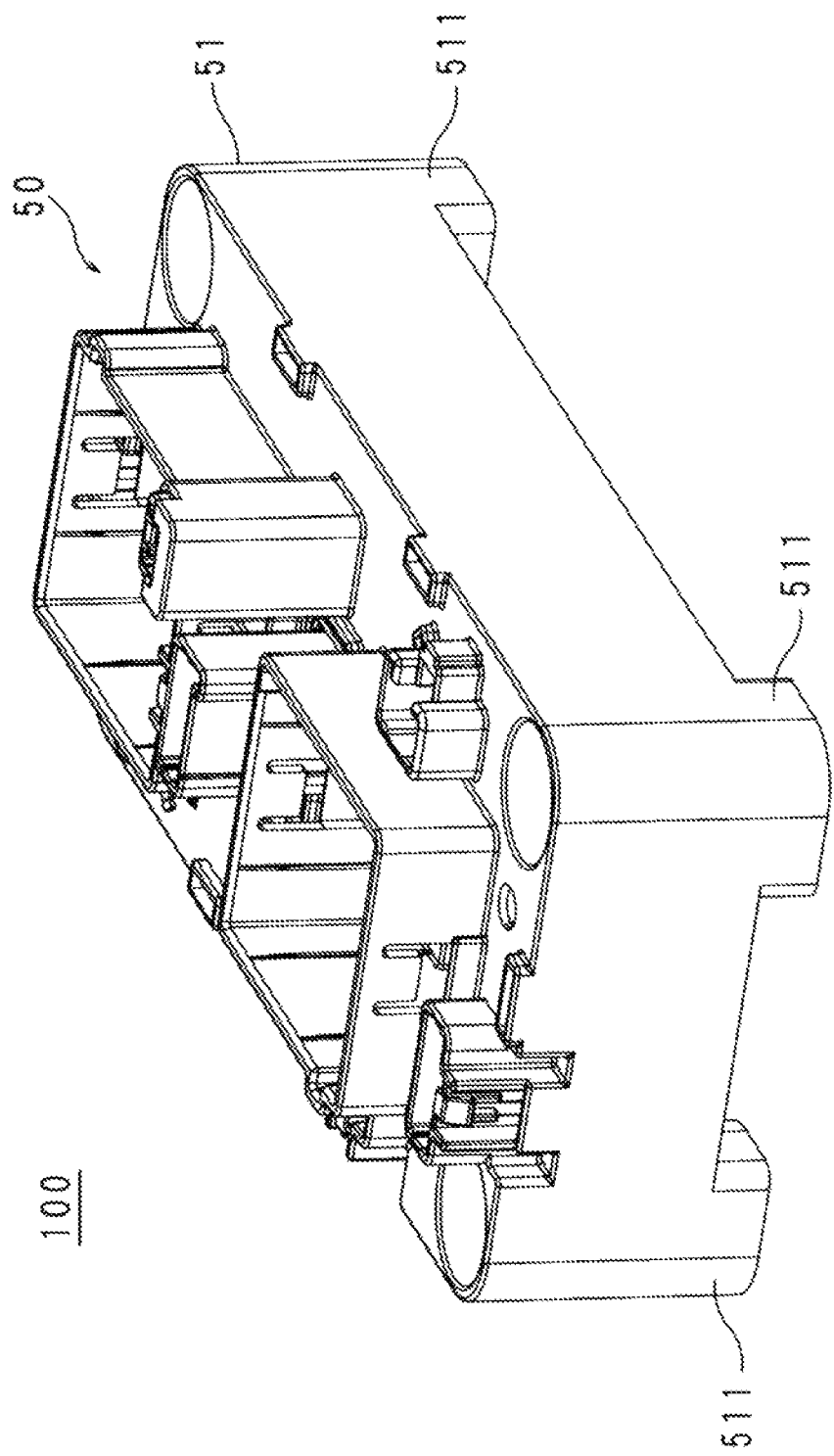
FIG. 1 is a perspective view showing an electronic module according to the present embodiment.

First, embodiments of the present disclosure will be listed and described. At least some of the embodiments described below may be combined freely.

An electronic module according to an embodiment of the present disclosure is a vehicle electronic module including a casing that is to be fixed to an object, the casing including a first plate portion facing the object and a second plate portion opposed to the first plate portion, wherein the electronic module includes: a connection portion that is provided on the second plate portion, and to which an external connector is to be connected; and a fuse portion disposed overlapping the connection portion in an opposing direction of the first plate portion and the second plate portion.

In the present embodiment, the electronic module includes a first plate portion and a second plate portion that are opposed to each other, a connection portion to which an external connector is to be connected is provided on the second plate portion, and a fuse portion is disposed overlapping the connection portion in an opposing direction of the first plate portion and the second plate portion. Accordingly, enhanced space saving and increased compactness can be achieved.

In the electronic module according to an embodiment of the present disclosure, the fuse portion is fixed to the second plate portion.

In the present embodiment, the fuse portion and the connection portion are both fixed to the second plate portion. Accordingly, if the second plate portion is bent by external pressure applied when the external connector is inserted into the connection portion, the fuse portion also shifts together with the second plate portion, and thus collision between the connection portion and the fuse portion can be prevented.

The electronic module according to an embodiment of the present disclosure includes a peripheral wall portion extending from a peripheral edge of the second plate portion to the first plate portion side, wherein the connection portion is provided toward the peripheral wall portion.

In the present embodiment, the connection portion is provided toward a peripheral wall portion extending from a peripheral edge of the second plate portion. That is, the connection portion is provided in the vicinity of the peripheral edge of the second plate portion. Accordingly, the second plate portion can be kept from being bent by external pressure applied when the external connector is inserted into the connection portion, thus preventing collision between the connection portion and the fuse portion as much as possible.

In the electronic module according to an embodiment of the present disclosure, the fuse portion includes a leg portion configured to maintain an interval with the connection portion in the opposing direction.

In the present embodiment, the fuse portion uses a leg portion to maintain an interval with the connection portion. Accordingly, even if the second plate portion is bent by external pressure applied when the external connector is inserted into the connection portion, collision between the connection portion and the fuse portion can be prevented.

In the electronic module according to an embodiment of the present disclosure, the connection portion protrudes in a direction intersecting the second plate portion, and an end portion of the connection portion is engaged with the fuse portion.

In the present embodiment, an end portion of the connection portion is engaged with the fuse portion. Accordingly, in an operation of assembling the electronic module, the connection portion serves as a positioning portion for the fuse portion, and thus there is no need to provide a separate positioning portion, thus reducing the number of components.

Specific examples of an electronic module power according to embodiments of the present disclosure will be described below with reference to the drawings. It should be noted that the present disclosure is not limited to these examples, and is intended to include all modifications which fall within the scope of the claims and the meaning and scope of equivalents thereof.

In the following, the present embodiment will be described, using, as an exemplary electronic component, a vehicle electronic module to which a relay is to be mounted.

Figure 2:
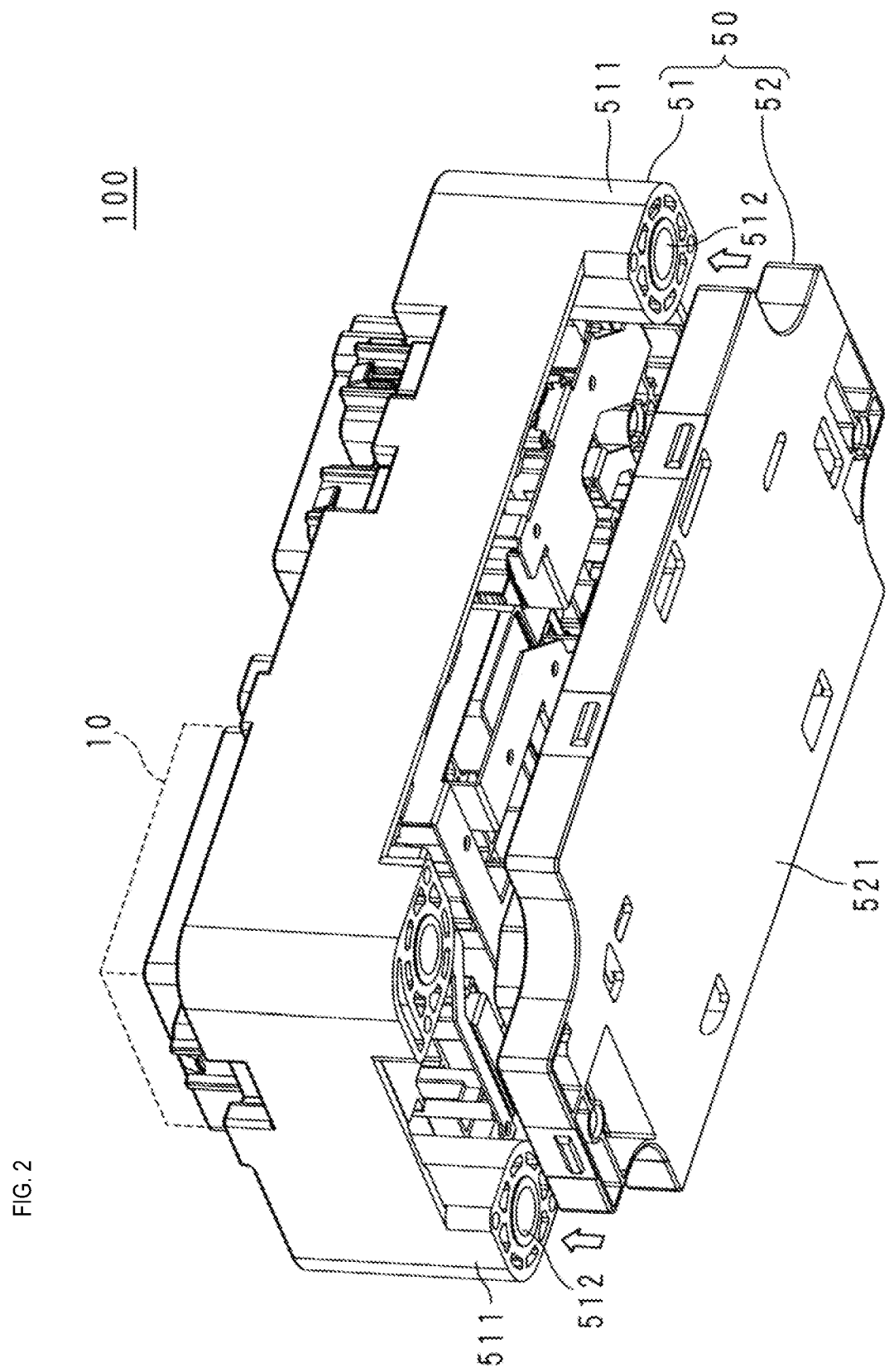
FIG. 2 is a partial exploded view of the electronic module according to the present embodiment.
Figure 3:
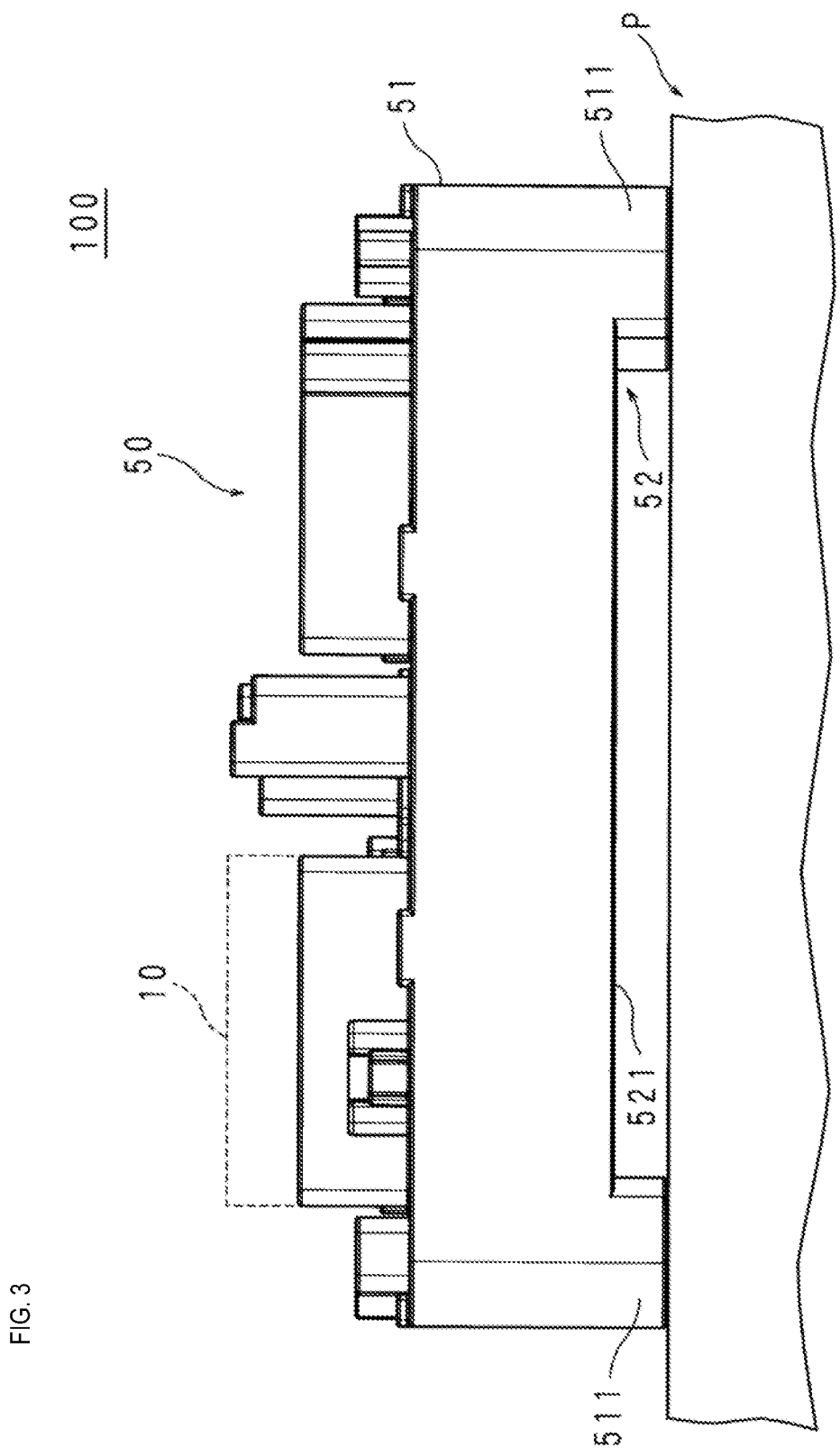
FIG. 3 is a side view showing the electronic module according to the present embodiment.

FIG. 1 is a perspective view showing an electronic module 100 according to the present embodiment, FIG. 2 is a partial exploded view of the electronic module 100 according to the present embodiment, and FIG. 3 is a side view showing the electronic module 100 according to the present embodiment.

The electronic module 100 can be attached to an outer side of a battery pack P (object) of an electric vehicle (EV), for example. The electronic module 100 includes a casing 50 to which a relay 10 is mounted, for example. For example, the relay 10 is switched on in a state in which the vehicle is caused to travel, and is switched off in a state in which the vehicle is not caused to travel.

The casing 50 is made of a resin, for example, and includes a lower case 52 and an upper case 51 that covers the lower case 52. The casing 50 is attached to the battery pack P such that a bottom plate 521 (first plate portion) of the lower case 52 faces the battery pack P. More specifically, a leg portion 511 having a bottomed tubular shape is provided at each of the four corners of the upper case 51, and a through hole 512 is formed in the bottom of each of the leg portions 511. The casing 50 (electronic module 100) can be attached to the battery pack P, for example, by passing screws through the through holes 512 of the leg portions 511, and threadably engaging the screws with the battery pack P.

At this time, in the electronic module 100, the bottom plate 521 of the lower case 52 is opposed to the outer surface of the battery pack P. For the sake of convenience of the following description, in the opposing direction of the electronic module 100 and the battery pack P, the electronic module 100 side will be referred to as the upper side, and the battery pack P side will be referred to as the lower side.

Figure 4:
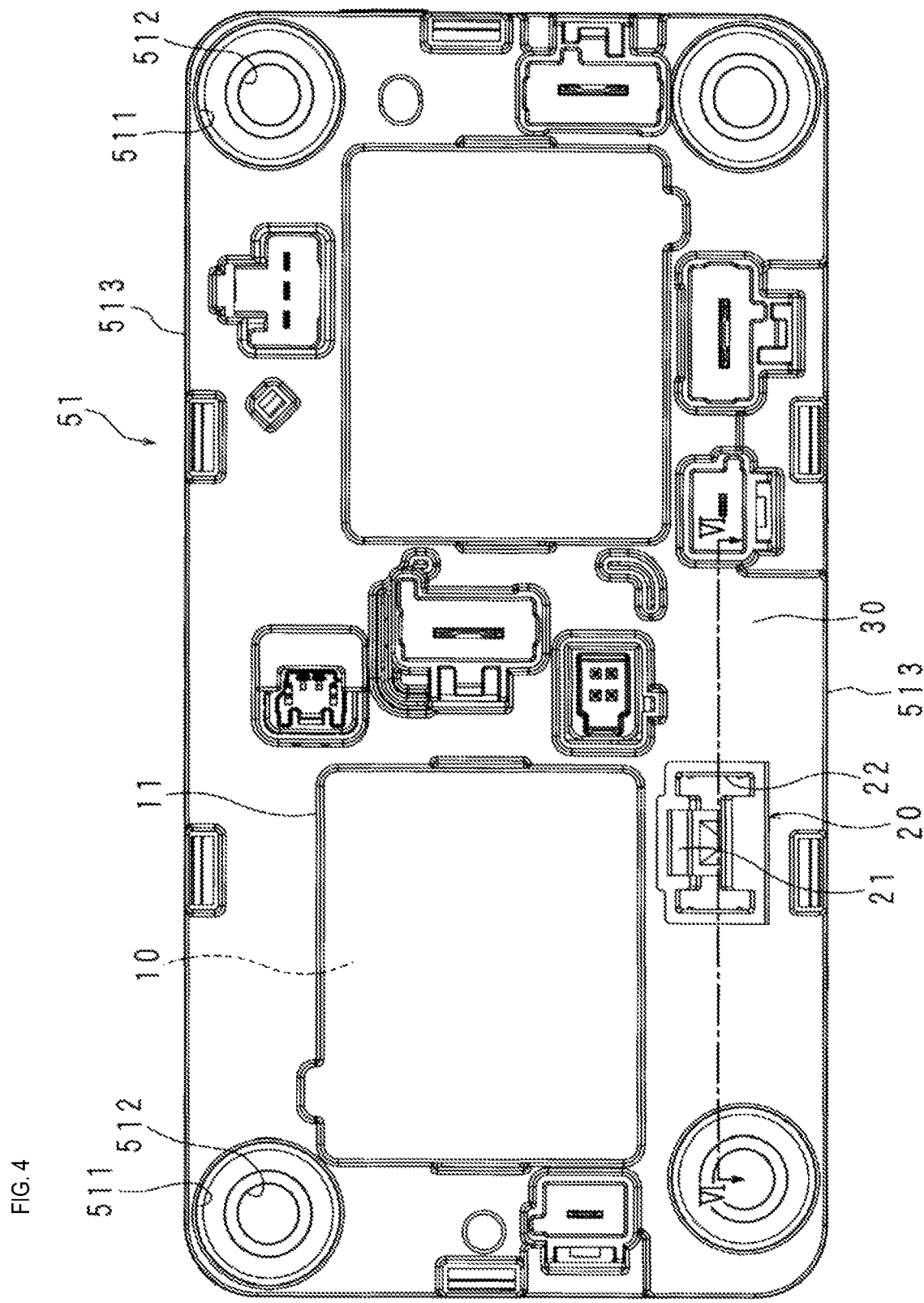
FIG. 4 is a plan view of an upper case of the electronic module according to the present embodiment.
Figure 5:
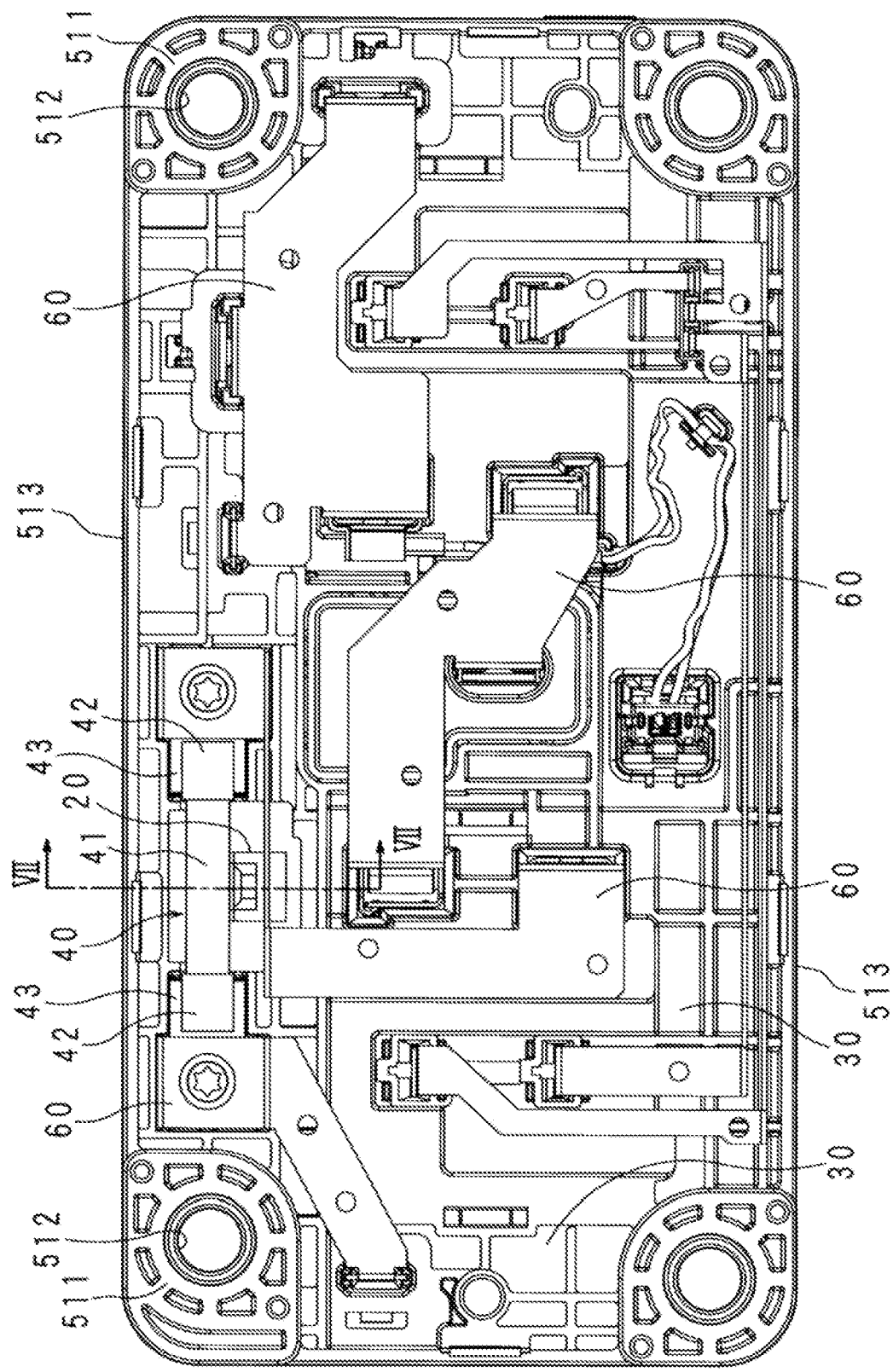
FIG. 5 is a bottom view of the upper case of the electronic module according to the present embodiment.

FIG. 4 is a plan view of the upper case 51 of the electronic module 100 according to the present embodiment, and FIG. 5 is a bottom view of the upper case 51 of the electronic module 100 according to the present embodiment. The upper case 51 has the shape of a flat casing with one surface open, and a plurality of bus bars 60, a fuse portion 40, and so forth are attached inside the upper case 51.

The upper case 51 includes a ceiling plate 30 (second plate portion) opposed to the bottom plate 521 of the lower case 52. The ceiling plate 30 has a substantially rectangular shape, and a leg portion 511 protrudes from each of the four corners of the ceiling plate 30 to the lower case 52 side. A peripheral wall portion 513 extends from a peripheral edge of the ceiling plate 30 to the lower case 52 side.

A mounting portion 11 for mounting the relay 10 is provided on the outer surface of the ceiling plate 30. The mounting portion 11 is a bottomed tubular recess formed on the ceiling plate 30, and a guiding portion having a quadrangular tubular shape is provided standing upright at a peripheral edge of the recess, in a direction intersecting the ceiling plate 30. The relay 10 is guided by the guiding portion, and inserted into the mounting portion 11.

On the ceiling plate 30, a connection portion 20 that is to be connected to an external connector is provided in the vicinity of an edge thereof, or in other words, toward the peripheral wall portion 513 relative to the center. The connection portion 20 includes a connection terminal 21, an insertion hole 22, and a tube portion 23, which will be described later. The insertion hole 22 extends through the ceiling plate 30 from the inside to the outside thereof, and the connection terminal 21 is provided inside the tube portion 23.

A terminal is provided inside a housing of the external connector. When the connector is inserted into the connection portion 20, the housing engages with the insertion hole 22, and the terminal inside the housing is electrically connected to the connection terminal 21.

On a plurality of portions of the inner surface of the ceiling plate 30, ribs are provided, and a plurality of pedestals 31 for attaching the bus bars 60, the fuse portion 40, and so forth are provided. The bus bars 60 and the fuse portion 40 are attached to the pedestals 31.

The fuse portion 40 includes a fuse, and prevents overcurrent from flowing. The fuse portion 40 is provided toward the peripheral wall portion 513 relative to the center. In addition, the fuse portion 40 is disposed overlapping the connection portion 20 in the opposing direction of the bottom plate 521 of the lower case 52 and the ceiling plate 30 of the upper case 51.

Figure 6:
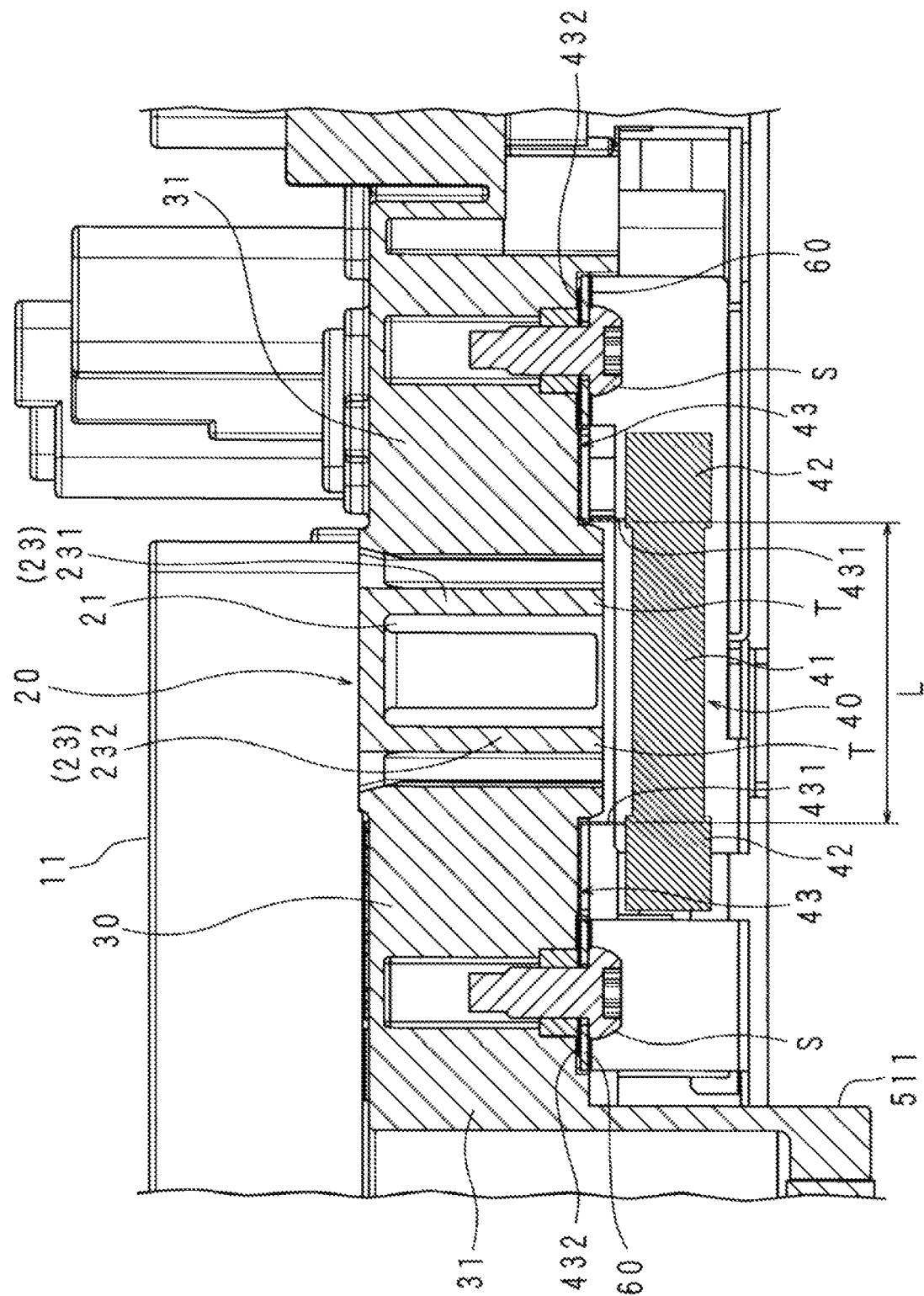
FIG. 6 is a longitudinal cross-sectional view taken along the line VI-VI in FIG. 4.
Figure 7:
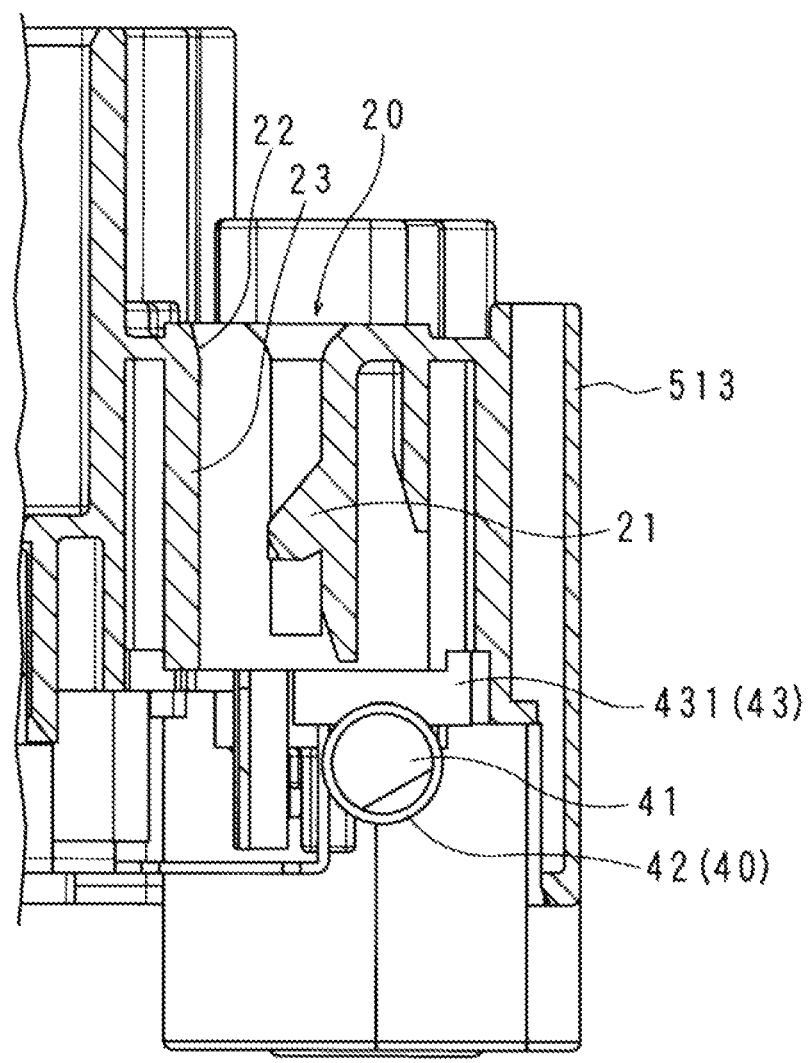
FIG. 7 is a longitudinal cross-sectional view taken along the line VII-VII in FIG. 5.

FIG. 6 is a longitudinal cross-sectional view taken along the line VI-VI in FIG. 4, and FIG. 7 is a longitudinal cross-sectional view taken along the line VII-VII in FIG. 5.

As shown in FIGS. 6 and 7, the fuse portion 40 is disposed at a position aligned with the connection portion 20, in the opposing direction of the bottom plate 521 and the ceiling plate 30, or in other words, directly below the connection portion 20.

Since the fuse portion 40 is disposed overlapping the connection portion 20 in the opposing direction of the bottom plate 521 and the ceiling plate 30 in this manner, it is possible to achieve enhanced space saving and increased compactness as compared with a case where the connection portion 20 and the fuse portion 40 are disposed in a dispersed manner.

Although the above description is given taking, as an example, a case where the fuse portion 40 is attached to a pedestal 31 of the upper case 51 (ceiling plate 30), the present disclosure is not limited thereto. As long as the fuse portion 40 is disposed below the connection portion 20, the above-described effects can be achieved even if the fuse portion 40 is fixed to the lower case 52.

On the inner surface of the ceiling plate 30, the tube portion 23 having a rectangular shape as viewed in a transverse cross section is provided surrounding the insertion hole 22. The tube portion 23 protrudes downward, or in other words, to the bottom plate 521 side of the lower case 52, from the inner surface of the ceiling plate 30. In addition, the connection terminal 21 is provided on the inner surface of the tube portion 23.

In the electronic module 100 according to the present embodiment, as described above, the connection portion 20 is provided toward the peripheral wall portion 513, which has high strength, relative to the center of the ceiling plate 30. Accordingly, the ceiling plate 30 can be kept from being bent to the lower side by external pressure applied when the operator inserts the external connector into the connection portion 20, thus preventing collision between an end portion of the connection portion 20 (tube portion 23) and the fuse portion 40 as much as possible.

Furthermore, in the electronic module 100 according to the present embodiment, as described above, the fuse portion 40 is also fixed to the ceiling plate 30, together with the connection portion 20. Accordingly, if the ceiling plate 30 is bent to the lower side by external pressure applied when the external connector is inserted into the connection portion 20, the fuse portion 40 also shifts to the lower side by this pressure, and it is thus possible to prevent collision between the end portion of the connection portion 20 (tube portion 23) and the fuse portion 40.

Then, in the electronic module 100 according to the present embodiment, the fuse portion 40 is fixed to the inner surface of the ceiling plate 30, and it is thus possible to attach the fuse portion 40 at the same time as when the bus bars 60 are attached to the pedestals 31 (upper case 51). Accordingly, the workability is improved as compared with a case where the fuse portion 40 is provided on the lower case 52.

The fuse portion 40 includes a fuse 41 with a cylindrical shape. The fuse 41 is made of glass or ceramic, for example, and a fuse element (not shown) is disposed thereinside. A cap 42 is attached on either side of the fuse 41. The caps 42 are made of a conductive metal, and have a bottomed cylindrical shape.

On the fuse portion 40, a fixing leg 43 is provided on the outer circumferential surface of each of the caps 42. The fixing legs 43 are each formed of a strip-shaped metal piece, and are bent in an L-shape. Each fixing leg 43 includes a base portion 431 protruding from the outer circumferential surface of the cap 42 in the radial direction of the cap 42, and a bent portion 432 that is bent at an end portion of the base portion 431 in a direction intersecting the protruding direction of the base portion 431. The bent portion 432 extends along the longitudinal direction of the fuse 41. That is, the fixing legs 43 are provided spaced apart from each other in the longitudinal direction of the fuse 41, the base portions 431 are opposed to each other, and the bent portions 432 are parallel to each other.

At an end portion of each of the fixing legs 43 (bent portions 432), a through hole (not shown) extending through the fixing leg 43 in the thickness direction is formed. By passing a screw S through the through hole and threadably engaging the screw S with a pedestal 31 of the ceiling plate 30, the fuse portion 40 can be screwed to the pedestal 31 (ceiling plate 30).

In this manner, the fuse portion 40 includes the fixing legs 43, and is fixed to the pedestal 31 via the fixing legs 43. That is, using the fixing legs 43, the fuse 41 of the fuse portion 40 is disposed distanced from an end portion of the connection portion 20 (tube portion 23) by a predetermined interval in the opposing direction of the bottom plate 521 and the ceiling plate 30.

Accordingly, even if the ceiling plate 30 is bent to the lower side by external pressure applied when the operator inserts the external connector into the connection portion 20, it is possible to prevent collision between the end portion of the connection portion 20 (tube portion 23) and the fuse portion 40 (fuse 41).

As described above, the tube portion 23 protrudes to the lower side from the inner surface of the ceiling plate 30. The size of the tube portion 23 is larger than the size of the pedestal 31 in the opposing direction of the bottom plate 521 and the ceiling plate 30. Accordingly, an end portion T of the tube portion 23 protrudes below the pedestal 31.

Furthermore, the tube portion 23 is configured such that the interval between a side wall 231 and a side wall 232 that are opposed to each other in the longitudinal direction of the fuse 41 of the fuse portion 40 is equal to the interval between the fixing legs 43 of the fuse portion 40.

That is, in the longitudinal direction of the fuse 41, an interval L between the opposing surfaces of the base portions 431 of the fuse portion 40 is equal to or slightly larger than the length/distance between the outer surface of the side wall 231 and the outer surface of the side wall 232 in the opposing direction of the side wall 231 and the side wall 232.

In this manner, the end portion T of the tube portion 23 protrudes below the pedestal 31, and the interval between the side wall 231 and the side wall 232 is equal to the interval between the fixing legs 43 of the fuse portion 40. Accordingly, the fuse portion 40 is engaged with the end portion T of the tube portion 23 when the fuse portion 40 is placed on the pedestal 31. That is, the end portion T of the tube portion 23 (the side wall 231 and the side wall 232) protruding below the pedestal 31 in the tube portion 23 is internally fitted between the base portions 431 of the fuse portion 40.

By having such a configuration, the electronic module 100 according to the present embodiment allows the operator to perform positioning of the fuse portion 40 using the end portion T of the tube portion 23 in an assembly operation.

That is, when attaching the fuse portion 40 to the inner surface of the ceiling plate 30, first, the operator externally fits the fixing legs 43 of the fuse portion 40 to the outside of the end portion T of the tube portion 23. Through such engagement, the position of the fuse portion 40 can be determined, and the fuse portion 40 can be easily fixed. Thereafter, the operator may screw the fuse portion 40 to the pedestal 31 using the screw S.

Accordingly, the electronic module 100 according to the present embodiment can improve the workability in the assembly operation.

It should be appreciated that the embodiments disclosed herein is to be construed in all respects as illustrative and not limiting. The scope of the present disclosure is defined by the claims, rather than the description of the embodiments above, and is intended to include all modifications which fall within the scope of the claims and the meaning and scope of equivalents thereof.

What is claimed is:

1. A vehicle electronic module comprising a casing that is to be fixed to an object, the casing including a first plate portion facing the object and a second plate portion opposed to the first plate portion, wherein the electronic module comprises:
a connection portion that is provided on the second plate portion, and to which an external connector is to be connected, the connection portion including a tube extending along a height of the second plate portion, the tube having a top opening for receiving the external connector, the top opening opposite of a bottom end; and a fuse portion disposed on the second plate portion and disposed beneath the bottom end of the tube and traverses the bottom end of the tube in a direction orthogonal to the height of the second plate portion.

2. The electronic module according to claim 1, wherein the fuse portion is fixed to the second plate portion.

3. The electronic module according to claim 1, comprising:

a peripheral wall portion extending from a peripheral edge of the second plate portion to the first plate portion side,
wherein the connection portion is provided toward the peripheral wall portion.

4. The electronic module according to claim 1, wherein the fuse portion includes a leg portion configured to maintain an interval with the bottom end of the connection portion in the opposing direction.

5. The electronic module according to claim 1, wherein the connection portion protrudes in a direction intersecting the second plate portion, and an end portion of the connection portion is engaged with the fuse portion.

6. The electronic module according to claim 2, comprising:

a peripheral wall portion extending from a peripheral edge of the second plate portion to the first plate portion side,
wherein the connection portion is provided toward the peripheral wall portion.

7. The electronic module according to claim 2, wherein the fuse portion includes a leg portion configured to maintain an interval with the bottom end of the connection portion in the opposing direction.

8. The electronic module according to claim 3, wherein the fuse portion includes a leg portion configured to maintain an interval with the bottom end of the connection portion in the opposing direction.

9. The electronic module according to claim 2, wherein the connection portion protrudes in a direction intersecting the second plate portion, and an end portion of the connection portion is engaged with the fuse portion.

10. The electronic module according to claim 3, wherein the connection portion protrudes in a direction intersecting the second plate portion, and an end portion of the connection portion is engaged with the fuse portion.

11. The electronic module according to claim 4, wherein the connection portion protrudes in a direction intersecting the second plate portion, and an end portion of the connection portion is engaged with the fuse portion.

* * * * *